United States Patent [19]

Blumenthal

[11] Patent Number: 4,868,490

[45] Date of Patent: Sep. 19, 1989

[54] METHOD AND APPARATUS FOR SHEET RESISTANCE MEASUREMENT OF A WAFER DURING A FABRICATION PROCESS

[75] Inventor: Roc Blumenthal, Dallas, Tex.

[73] Assignee: Texas Instruments Incorporated, Dallas, Tex.

[21] Appl. No.: 244,754

[22] Filed: Sep. 14, 1988

[51] Int. Cl.$^4$ .................. G01R 27/08; H01L 21/00
[52] U.S. Cl. ........................... 324/64; 324/62; 29/569.1; 118/712
[58] Field of Search ............... 324/64, 62, 65, 158 F; 427/8-10; 437/8; 29/569.1; 118/712

[56] References Cited

U.S. PATENT DOCUMENTS

| | | | |
|---|---|---|---|
| 3,660,250 | 5/1972 | Duffy et al. | 324/64 X |
| 4,335,350 | 6/1982 | Chen | 324/64 |
| 4,536,051 | 8/1985 | Smith et al. | 324/158 F X |
| 4,543,576 | 9/1985 | Hieber et al. | 427/8 X |
| 4,726,961 | 2/1988 | Diem et al. | 427/8 X |
| 4,780,086 | 10/1988 | Jenner et al. | 324/158 F X |

OTHER PUBLICATIONS

Holmwood, Sheet Resistance Monitor for Deposition of Thin Films, 8-1966, IBM Tech. Dis. Bulletin, Vol. 9, No. 3, pp. 247-248.

*Primary Examiner*—Reinhard J. Eisenzopf
*Assistant Examiner*—Jack B. Harvey
*Attorney, Agent, or Firm*—Gary C. Honeycutt; Kelvin Sharp; Rhys Merrett

[57] ABSTRACT

The sheet resistance of an integrated circuit wafer (W) may be measured during an integrated circuit fabrication process step. A chamber (26) has disposed therein a plurality of probes (40) each having a conductive tip (84) for abutting the work surface at a respective preselected location thereon. A current source (52, 114) is connected by at least two conductors (118, 112) between at least two of the tips (110, 116). A voltmeter (50) is connected between at least two of the tips (120, 126) by further conductors (122, 124). The voltmeter (50) is read out while the process step is being performed, and the voltage is converted to a sheet resistance according to the preselected electrical configuration of the circuit and a predetermined formula.

23 Claims, 2 Drawing Sheets

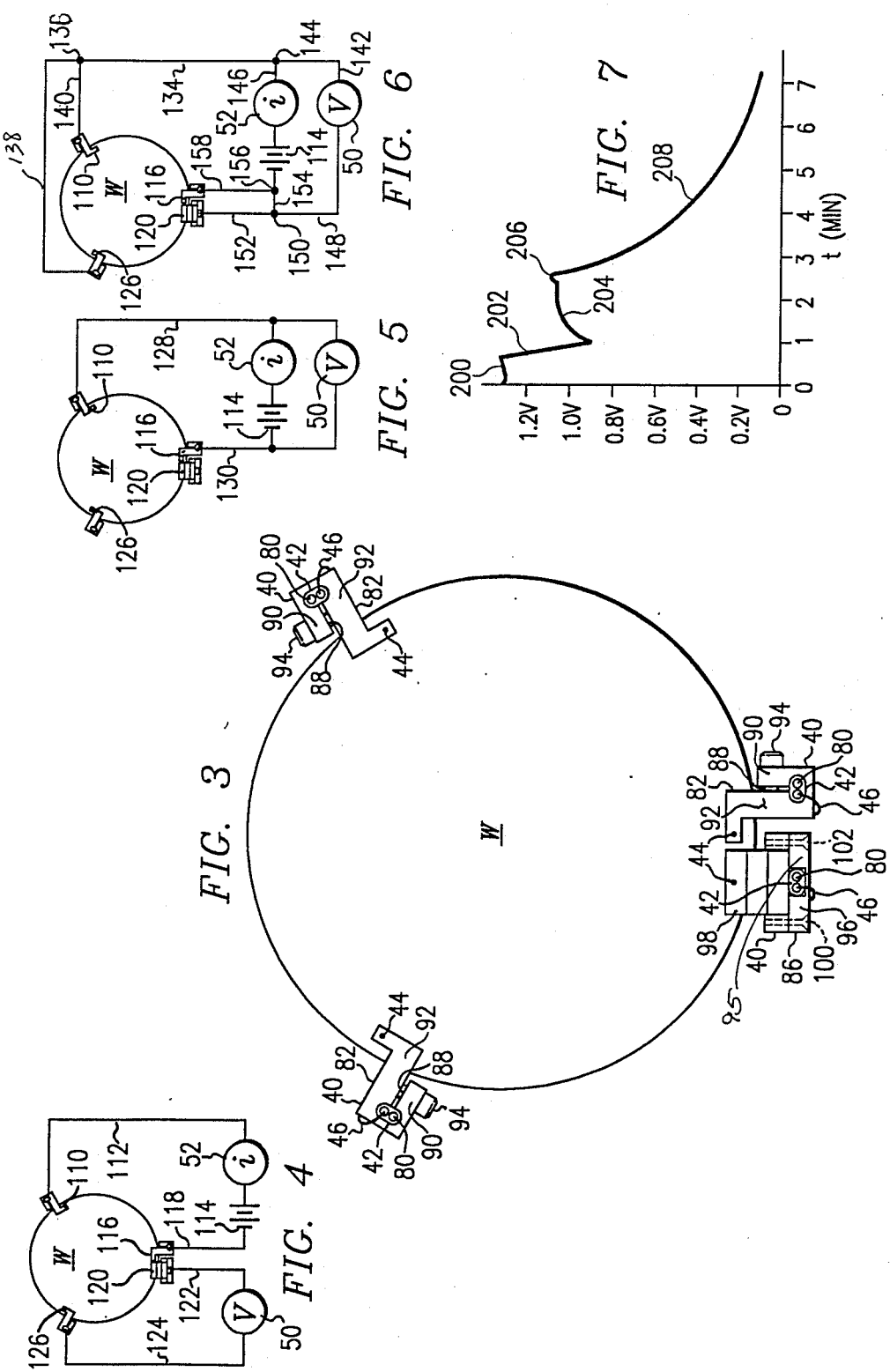

METHOD AND APPARATUS FOR SHEET RESISTANCE MEASUREMENT OF A WAFER DURING A FABRICATION PROCESS

TECHNICAL FIELD OF THE INVENTION

The present invention relates in general to integrated circuit fabrication techniques, and more particularly to a method and apparatus for measuring integrated circuit wafer sheet resistance in situ during a fabrication process step.

BACKGROUND OF THE INVENTION

It is known that for certain metallic films deposited on a surface of an integrated circuit wafer, the sheet resistance of the film will vary inversely with its thickness. For this reason, sheet resistance measurements are often made of semiconductor wafers after the completion of a selected metallic film deposition step to determine if the deposition parameters of the step are correct. The sheet resistance measurement is usually performed by the application of a plurality of probes, a first two of which are connected to a current source and voltage supply in series and a second two of which, which may be the same or different from the first two probes, are connected to a voltmeter. The voltmeter reading may be used to determine the sheet resistance by a predetermined formula depending on the electrical configuration of the probes. From the sheet resistance and the bulk resistivity, the thickness of the film may be determined.

In conventional reactors, no method has been developed to measure the sheet resistance in situ while the deposition process is occurring, and therefore the operator must guess when the metallic deposition step should be ended. The film deposition parameters must therefore be arrived at by a cut-and-try method that uses further time and materials, and which may not be reliable if a variance in one of the process parameters goes unnoticed. A need has therefore arisen for determining film thickness by measuring a sheet resistance of an integrated circuit wafer in situ.

SUMMARY OF THE INVENTION

One aspect of the invention comprises apparatus for measuring sheet resistance of a work surface of an integrated circuit wafer during an integrated circuit fabrication process step. The apparatus includes a chamber in which the process step is performed on the work surface. A plurality of probes are disposed in the chamber, with each probe having a conductive tip for abutting the work surface at a respective preselected location thereon. Conductors are provided for connecting a constant current source between at least two of the tips. A voltmeter is further connected between two of the tips, which may be the same or different from the tips between which the current source is connected depending on the electrical measurement configuration chosen. The voltmeter is read out while the process step is being performed. A principal advantage of the invention is that the sheet resistance of the work surface may be determined at any time during the process step.

Another aspect of the invention comprises a method for measuring the sheet resistance on an integrated circuit wafer during a process for fabricating an integrated circuit. According to this method, a plurality of rigid conductive probe tips are mounted on respective lift fingers and are used to press an inverted integrated circuit wafer against a top plate in a reactor. A current source is electrically connected between at least two of the conductive tips, and a voltmeter is connected between either these two tips or two other selected tips in a preselected electrical configuration. While the process is being performed, such as the deposition of a metallic film, the voltmeter is monitored. The monitored voltage is converted to a sheet resistance based upon the preselected electrical configuration and a predetermined formula. A desired end point of the process may therefore be advantageously determined in "real time," that is, even as the process continues.

BRIEF DESCRIPTION OF THE DRAWINGS

Further aspects of the invention and their advantages may be discerned from the following detailed description taken in conjunction with the appended drawings in which:

FIG. 3 is a schematic plan view of an integrated circuit wafer disposed within the vacuum processor shown in FIG. 1, illustrating the disposition of a plurality of lift fingers about the wafer's periphery;

FIG. 4 is a schematic electrical diagram showing a first possible electrical measuring configuration of the invention;

FIG. 5 is an electrical schematic diagram showing a second possible electrical configuration according to the invention;

FIG. 6 is a schematic electrical diagram showing a third possible electrical configuration according to the invention; and FIG. 7 is a graph of a voltage measurement over time during an integrated circuit wafer process step with an electrical measuring configuration as shown in FIG. 4.

DETAILED DESCRIPTION OF THE INVENTION

Figure 1:
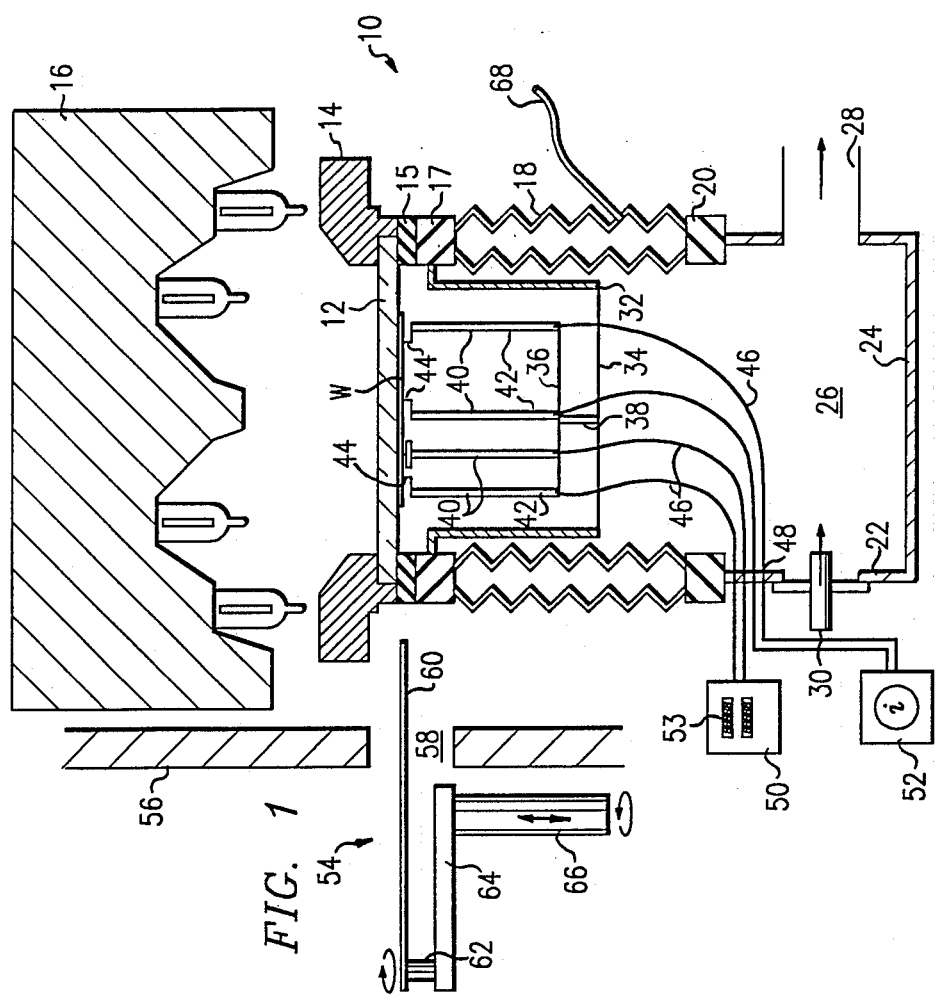
FIG. 1 is a schematic elevational, part-sectional view of an integrated circuit wafer vacuum processor incorporating the invention.

Referring first to FIG. 1, a vacuum processor is indicated generally at 10 in part-elevational, part-sectional view. A quartz or sapphire top plate 12 is held in place by an annular member 14 and a quartz ring 15. The particular vacuum processor 10 shown has a heat lamp 16 disposed above the transparent plate 12.

An annular quartz ring 17 is provided to mate with annular ring 15 to provide a seal therewith. A cylindrical bellows 18 is sealably connected to annular ring 17 and extends downwardly to an annular quartz or glass ring 20. A cylindrical bottom wall indicated schematically at 22, and a floor 24, complete the delimiting of a sealable chamber 26 in which an integrated circuit process takes place. Wall 22 and floor 24 are fabricated from suitably process-impervious materials such as quartz or glass.

Chamber 26 is in operation evacuated by a vacuum source 28. A deposition, dopant or etchant gas is provided through a tube 30 that is sealingly introduced through bottom wall 22. Tube 30 introduces the gas into a distribution manifold (not shown) in the top portion of chamber 26. This manifold has been omitted for clarity.

A rigid member schematically illustrated at 32 is affixed to quartz ring 17 and extends downwardly therefrom. A leaf spring indicated schematically at 34 may for example be affixed to vertical rigid member 32. A finger platform schematically shown at 36 is attached thereto as at its center by an attachment schematically shown at 38.

A plurality of upstanding lift fingers 40 each include an upstanding tube member or barrel 42 that has its bottom end affixed to the platform 36. Each finger 40 further has at least one elongate probe 44 affixed to a top end of barrel 42 such that the axis of probe 44 is in parallel to the axis of barrel 42. It is preferred that at least four probes 44 be provided. The support structure for fingers 40 is only schematically illustrated. The structure used for affixing fingers 40 to ring 17 may be varied substantially from the schematic structure shown, so long as a mechanism is provided to upwardly spring-bias fingers 40 with respect to ring 17.

Each probe 44 is conductively connected to a flexible conductor 46, which extends through a bore (not shown in FIG. 1) within a respective elongate barrel 42 to the top end of a finger 40, and extends downwardly within the chamber 26 to exit out of a sealed port 48. In the illustrated electrical configuration, two of the conductors 46 are connected to a voltmeter 50, while two other conductors 46 are connected to a constant current source 52. Voltmeter 50 has a visual readout 53. The particular electrical configuration illustrated may be changed according to the measurement technique employed, as will be more completely explained in conjunction with FIGS. 4–6.

An adjacent chamber indicated generally at 54 has a vertical wall 56 that has an opening 58 therein. An integrated circuit wafer support blade 60 usually resides within chamber 54. Blade 60 is connected through an axis 62 to an arm 64, which in turn is connected to an axis 66. Suitable mechanisms are provided to electrically or hydraulically manipulate axes 66 and 62 such that integrated circuit wafer blade 60 may be extended into chamber 26, as explained below, or retracted as schematically shown in FIG. 1.

An air or other pneumatic gas source 68 is connected to the interior of bellows-wall 18. FIG. 1 shows the bellows-wall 18 in an upwardly-extended position, such that annular ring 17 mates with quartz ring 15. Wall 18 is retractable to a retracted position (not shown) such that sufficient space exists between annular ring 17 and ring 15 for the blade 60 to be extended into chamber 26 together with an integrated circuit wafer loaded thereon. The extension and retraction of bellows-wall 18 is controlled for example by a pressurized air-vacuum source from line 68 or two or more such lines.

While bellows-wall 18 is in its retracted position, the tips of probes 44 are biased by the leaf spring 34 to be slightly but measurably above the top of annular ring 17. A semiconductor wafer W is loaded on to blade 60 within chamber 54, and axes 62 and 66 are actuated to extend blade 60 into the processor chamber 26. The disposition of fingers 40 is such that they will not block the lateral progress of blade 60. The semiconductor wafer W is then lowered onto the tips of probes 44, with this movement being made possible by an up-and-down movement on the part of axis 66.

After wafer W is supported on tips 44, the blade 60 is withdrawn. Subsequently, bellows-wall 18 is reinflated such that quartz annular ring 17 will make sealed contact with quartz ring 15. Because lift fingers 40 are upwardly spring-biased by spring 34, the integrated circuit wafer W is forced against the bottom surface of plate 12. A selected integrated circuit process step is then performed on an inverted work surface of wafer W in this position, such as a chemical vapor deposition of tungsten or other metal on this surface.

A sheet resistance measurement of the work surface of integrated circuit wafer W is useful in determining the present thickness of any metallic film being deposited thereon. A predetermined constant current is supplied by constant current source 52 to at least one of the probes 44, and a circuit back to source 52 is provided through at least one other probe 44. A voltage is read out between these same probes 44 or between different ones, depending on the measuring technique and electrical configuration used. The voltage is read out on readout 53 while the process continues, and can be converted directly to a sheet resistance by the employment of a predetermined formula that varies according to the placement of the probes 44 and the electrical configuration used. In this manner, the depth of the metallic deposition may be monitored as the deposition is occurring and a deposition end point may be determined in real time.

While the sheet resistance measurement technique according to the invention is particularly useful for the inverted-wafer vacuum processor type shown, the technique can also be employed for more conventional work-surface-side-up reactors. In this alternative embodiment (not shown) probes 44 would not be mounted on lift fingers 40 but would instead use a different structural means of support so as to make contact to the top side of integrated circuit wafer W.

Figure 2:
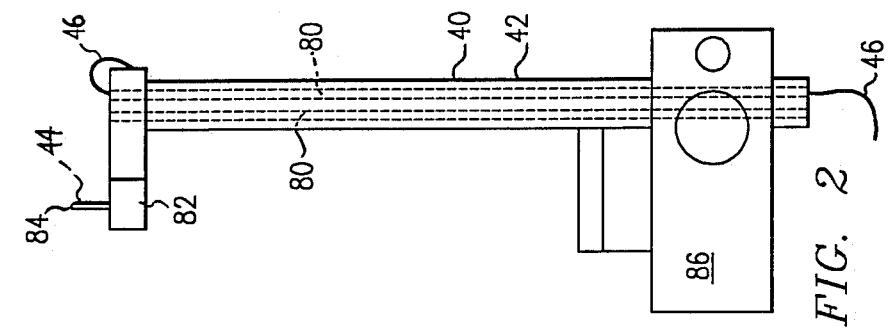
FIG. 2 is a longitudinal sectional view of a single combination probe and integrated circuit wafer lift finger according to the invention.

FIG. 2 is an elevational view of a preferred lift finger 40. In the illustrated embodiment, two hollow bores shown in phantom at 80 are formed within the elongate tube or barrel 42 such that one or two conductors 46 (one shown) can be threaded through them, one per bore 80. The flexible conductor 46 is attached as by soldering in the illustrated embodiment to a horizontal arm 82 that is itself highly conductive.

Arm 82 may for example be clamped to barrel 42 at one end of the arm 82 (see FIG. 3). A bore (not shown) is drilled through the end of arm 82 opposite the end clamped to the barrel 42, and a conductive probe 44 is inserted into this bore and affixed therein. The probe 44 has an exposed conductive tip 84, but the remaining surfaces of probe 44, arm 82, conductor 46, and barrel 42 are preferably covered with a protective coating impervious to the chemicals used in the fabrication process step. At its lower end, barrel 42 is affixed to a support member 86, which in turn is affixed to platform 36 (FIG. 1) such that finger 40 will be spring-biased in an upward direction substantially parallel to its length.

FIG. 3 is a schematic plan view of a plurality of fingers 40 as they are disposed around the periphery of an integrated circuit wafer W, the view being taken from beneath wafer W as it is illustrated in FIG. 1. Three lift fingers 40 are disposed equidistantly around the periphery of the integrated circuit wafer W. These three fingers 40 are of the type illustrated in FIG. 2. In addition, a fourth lift finger 86 is provided that shows an alternative structural embodiment. The lift fingers 40 and 86 are positioned such that their respective probes 44 will contact the work surface of integrated wafer W near its periphery and such that each probe 44 is radially separated by about 120° from two other probes 44.

The arm 82 of each respective finger 40 may be fabricated out of a single piece of metal, with an orifice drilled therein to accommodate the barrel 42. A channel 88 is formed from the orifice to the inner margin of the arm 82, such that channel 88 defines a pair of clamping elements 90 and 92 which can for example be clamped together by means of a bolt 94 around the barrel 42. On the other hand, an arm 95 of the finger 86 has two discrete components—a first piece 96 with a vertical channel formed therein to receive the barrel 42, and a second piece 98 on which is mounted a probe 44. Pieces 96 and 98 have suitable bores for screws shown in phantom at 100 and 102 that operate to clamp the pieces 96 and 98 together around a barrel 42. As shown, the finger 86 is positioned such that its probe 44 is close to the probe 44 of another finger 40.

Turning now to FIG. 4, a schematic electrical diagram of a first electrical configuration for measuring the sheet resistance of wafer W is shown. In this configuration, an upper right hand contact 110 to wafer W is connected by a conductor 112 to one terminal of a current source 52 and an accompanying voltage supply 114 that is connected in series therewith. A second terminal of constant current source 52/voltage supply 114 is connected to a lower right hand contact 116 through a conductor 118. One terminal of the voltmeter 50 is connected to a lower left hand contact 120 through a conductor 122, and a second terminal of voltmeter 50 is connected through a conductor 124 to an upper left hand contact 126. Contacts 110, 116, 120 and 126 are physically embodied by respective probe tips 84 (see FIG. 2).

This configuration is useful for the van der Pauw and Delta 4-point probe methods of sheet resistance measurement. These and other sheet resistance measurement techniques are more fully described in W. R. Runyan, *Semiconductor Measurements and Instrumentation*, McGraw-Hill (1975), pp. 69–75, incorporated herein by reference.

In FIG. 5, a two-point probe measurement technique is shown, wherein the contact 110 is connected through a conductor 128 to first terminals of both the constant current source 52/voltage supply 114 and the voltmeter 50. A second conductor 130 connects second terminals of constant current source 52/voltage supply 114 and voltmeter 50 to contact 116. In this configuration, contacts 120 and 126 are not used. This configuration is less preferred than the configurations illustrated in FIGS. 4 and 6 because the probe tip resistance of contacts 110 and 116 must be taken into account. In one embodiment these are approximately 1.7 ohms apiece. On the other hand, sheet resistance measurements for wafer metallic coatings are usually in the range of tenths of ohms. The resistance of the probe tips must therefore be precisely determined to get good results with this configuration.

FIG. 6 is a third electrical configuration that can be used with the invention. A conductor 134 is connected from a node 136 to a node 144. A second conductor 138 is connected from node 136 to contact 126. A third conductor 140 connects node 136 to contact 110. A conductor 142 connects a first terminal of the voltmeter 50 to the node 144. A conductor 146 connects a first terminal of the current source 52/voltage supply 114 to the node 144. A conductor 148 connects a second terminal of the voltmeter 50 to a node 150, which in turn is connected by a conductor 152 to contact 120. Node 150 is connected through a conductor 154 to a node 156, which is connected to a terminal of the current source 52/voltage supply 114 and further through a conductor 158 to contact 116. In this doubled two-point probe configuration, the apparent probe tip resistance need not be taken into account.

FIG. 7 is a representative voltage/time graph showing the operation of the invention during a process step of depositing a film of tungsten by chemical vapor deposition. To obtain the graph, a 100 milliampere constant current was supplied by an HP 6216A current source. The four-point probe electrical configuration shown in FIG. 4 was used. Voltage in volts is shown on the Y axis, while time in minutes is shown on the X axis.

A plurality of beginning curve segments 200–204 occur before the film deposition process step proper, and are artefacts of the heating and reheating of the semiconductor wafer W (FIG. 4) and the seeking of a desired temperature by a thermostat. The deposition process begins at point 206. A decreasing curve 208 is produced as a function of the increasing thickness of the tungsten film on the work surface, reflecting a decrease in voltage across the voltmeter terminals and a proportional reduction in sheet resistance. When a particular predetermined voltage is reached as shown by the voltmeter 50 (FIGS. 1 and 4), the process may be interrupted by the operator. The sheet resistance of the deposited metallic film is inversely related to its thickness by a predetermined function that further depends on the nature of the metal. The metallic film thickness can thus be derived.

While the present invention has been illustrated in conjunction with a vacuum processor in which the work surface has been inverted, the present invention can also be applied to more conventional semiconductor wafer reactors, or indeed to any process step where a wafer sheet resistance that varies during the process is desired to be measured. While it is preferred that the contact probes be incorporated into lift fingers or other structural support elements, they could also be provided by probes separate from the lift fingers.

The present invention provides an effective and advantageous way of measuring film resistance on an integrated circuit wafer in situ during a fabrication process step. While preferred embodiments and their advantages have been described in the above detailed description, the invention is not limited thereto but only by the scope and spirit of the appended claims.

What is claimed is:
1. Apparatus for measuring sheet resistance of a work surface of an inverted integrated circuit wafer during an integrated circuit fabrication process step, comprising:
   a chamber in which said process step is performed on said work surface;
   a plurality of lift fingers including probes disposed in said chamber, each probe having a conductive tip for supportively abutting said work surface at a respective preselected location thereon;
   a constant current source, at least two conductors for connecting said current source between at least two of said tips;
   a voltmeter, at least two conductors for connecting said voltmeter between at least two of said tips;
   an electrical configuration defined by the connections among said current source, said voltmeter and said tips; and
   a readout of said voltmeter for measuring sensed voltage while said process step is being performed, such that the sheet resistance of said work surface may be determined at any time during said process step based on said sensed voltage, said electrical configuration and a predetermined formula.

2. The apparatus of claim 1, wherein each lift finger is generally elongate and upstanding, each said probe mounted on an end of a respective lift finger for supporting said wafer.

3. The apparatus of claim 2, wherein said apparatus comprises an endless peripheral support member disposed laterally around said lift fingers, lower ends of said lift fingers opposite said ends affixed to said peripheral support member, said lift fingers operable to support said wafer above said lift fingers.

4. The apparatus of claim 3, wherein said lift fingers are affixed to said peripheral support member, by at least one spring assembly, a plate of said apparatus disposed above said wafer, said spring assembly operable to urge said lift fingers upwardly to press said wafer against said plate by spring tension.

5. The apparatus of claim 2, wherein each said lift finger includes an elongate longitudinal bore therethrough, each of said conductors threaded through a respective bore and conductively connected to said end of said lift finger.

6. The apparatus of claim 2, wherein said lift fingers and said probes are coated except on said conductive tip with a material inert to said fabrication process step.

7. The apparatus of claim 1, wherein a first pair of said conductive tips are connected to said voltmeter, a second pair of said conductive tips connected to said current source.

8. The apparatus of claim 1, wherein said voltmeter and said current source are connected in parallel between the same two of said tips.

9. The apparatus of claim 1, wherein first terminals of said current source and said voltmeter are both connected to two of said tips, second terminals of said current source and said voltmeter connected to another two of said tips.

10. A reactor for performing a fabrication process step on an integrated circuit wafer, comprising:
   a sealable chamber having a substantially horizontal support structure thereacross;
   a sealable entrance into said chamber for introducing an integrated circuit wafer thereinto;
   a plurality of upstanding elongate lift fingers disposed in said chamber, conductive upper end tips of said lift fingers disposed in a spaced-apart substantially horizontal coplanar relationship for supportively abutting a work surface of said wafer;
   a lifting mechanism coupled to said lift fingers for lifting a wafer supported thereon from a lower position to an upper position, an upper surface of said wafer abutting said support structure when said wafer is in said upper position;
   a plurality of conductors electrically coupled to respective ones of said end tips;
   a voltmeter connected between at least two of said conductors for measuring a voltage across said work surface therebetween; and
   a constant current source connected between at least two of said conductors for supplying a preselected constant current to said work surface, such that a sheet resistance for said work surface at a selected point in time during said fabrication process step may be derived from said voltage and said current according to a predetermined formula.

11. The reactor of claim 10, wherein said sealable chamber includes an endless peripheral support member which is affixed to said lifting mechanism, an upper margin of said peripheral support member being lower than said tips while said wafer is in said lower position;
   a spring assembly affixed to said lift fingers and said peripheral support member for biasing said lift fingers in an upward direction such that said upper surface of said wafer will be spring-biased against said supporting structure when said wafer is in said upper position.

12. The reactor of claim 10, and further comprising a vacuum source connected to the interior of said sealable chamber for substantially evacuating said chamber during said fabrication process step.

13. The reactor of claim 10, wherein each said lift finger has at least one longitudinal bore therethrough, each of said conductors threaded through a respective bore, an end of each of said conductors connected to an upper end of a respective lift finger near a respective tip.

14. The reactor of claim 10, wherein said lift fingers are coated, except for said conductive tips, with a substance substantially inert to said fabrication process step.

15. The reactor of claim 10, wherein said voltmeter is connected between a first pair of said conductors, said constant current source connected between a second pair of said conductors.

16. The reactor of claim 10, wherein said voltmeter and said constant current source are connected in parallel between one selected pair of said conductors.

17. The reactor of claim 10, wherein a first terminal of said voltmeter and a first terminal of said constant current source are connected in parallel to each of a selected pair of said conductors, a second terminal of said voltmeter and a second terminal of said constant current source connected to each of a second selected pair of said conductors.

18. A method for measuring the sheet resistance on an inverted wafer during a process for fabricating an integrated circuit, comprising the steps of:
   supportively abutting a plurality of rigid conductive probe tips against a work surface of the wafer downwardly facing such that the tips are in spaced-apart relation on the surface;
   electrically connecting a constant current source between at least two of the tips;
   electrically connecting a voltmeter between at least two of the tips;
   monitoring the voltmeter during a selected portion of the process; and
   converting the monitored voltage to a sheet resistance based on the configuration of the electrical connections and a predetermined formula.

19. The method of claim 18, and further comprising the step of depositing a metallic film on the work surface during said step of monitoring the voltmeter.

20. The method of claim 19, and further comprising the step of determining a metallic deposition endpoint when the voltage measured by the voltmeter reaches a predetermined value.

21. The method of claim 18, and further comprising the steps of:
   electrically connecting the voltmeter between a first pair of the tips; and
   electrically connecting the current source between a second pair of the tips.

22. The method of claim 18, and further comprising the steps of:
   connecting first terminals of both the voltmeter and the current source in parallel to one of the tips; and connecting second terminals of the voltmeter and the current source in parallel to a second one of the tips.

23. The method of claim 18, and further comprising the steps of:

connecting first terminals of both the voltmeter and the current source in parallel to a selected first pair of the tips; and connecting second terminals of the voltmeter and current source in parallel to a selected second pair of the tips different from the first pair.

* * * * *